(12) United States Patent
Kim et al.

(10) Patent No.: US 7,679,446 B2
(45) Date of Patent: Mar. 16, 2010

(54) VARIABLE-GAIN LOW-NOISE AMPLIFIER

(75) Inventors: Young Jin Kim, Goyang-si (KR); Myung Woon Hwang, Seoul (KR)

(73) Assignee: FCI Inc., Seongnam-si, Gyeonggi-do (KR)

( * ) Notice: Subject to any disclaimer, the term of this patent is extended or adjusted under 35 U.S.C. 154(b) by 103 days.

(21) Appl. No.: 12/040,303

(22) Filed: Feb. 29, 2008

(65) Prior Publication Data

US 2008/0231369 A1   Sep. 25, 2008

(30) Foreign Application Priority Data

Mar. 7, 2007   (KR) ..................... 10-2007-0022244

(51) Int. Cl.
    *H03G 3/00*   (2006.01)
(52) U.S. Cl. .................................. 330/282
(58) Field of Classification Search ........... 330/282, 330/283, 294, 311
    See application file for complete search history.

(56) References Cited

U.S. PATENT DOCUMENTS 7,319,364 B2 *   1/2008   Kim et al. ................... 330/295

\* cited by examiner

*Primary Examiner*—Robert Pascal
*Assistant Examiner*—Khiem D Nguyen
(74) *Attorney, Agent, or Firm*—Kile Goekjian Reed & McManus PLLC

(57) ABSTRACT

A variable-gain low-noise amplifier is provided. The variable-gain low-noise amplifier includes a first load, a second load, an input transistor, a pole/zero control circuit, and a gain control circuit. A first terminal of the first load is connected to a power-source voltage, and a second terminal thereof is connected to an output terminal. The second load is operated in response to a bias voltage, and a first terminal thereof is connected to the output terminal. A first terminal of the input transistor is connected to the second terminal of the second load, and a gate thereof is connected to an input terminal. The pole/zero control circuit adjusts frequency characteristics and a gain in response to at least one pole/zero control signal. A first terminal of the pole/zero control circuit is connected to the input terminal, and a second terminal thereof is connected to the output terminal. The gain control circuit adjusts the gain in response to at least one gain control signal. A first terminal of the gain control circuit is connected to a common terminal of the second load and the input transistor, and a second terminal thereof is connected to the input terminal, and a third terminal thereof of is connected to a ground voltage.

11 Claims, 4 Drawing Sheets

VARIABLE-GAIN LOW-NOISE AMPLIFIER

BACKGROUND OF THE INVENTION

1. Field of the Invention

The present invention relates to a low-noise amplifier, and more particularly, to a variable-gain low-noise amplifier.

2. Description of the Related Art

For implementation of good communication in a long distance, output power of a transmitter may be designed to be increased, or a sensitivity of a receiver may be designed to be improved. However, the approach for increasing the output power of the transmitter is not preferable due to limitation of power level of an output stage of the transmitter, influence to associated apparatuses, and cost thereof. Therefore, the approach for improving the sensitivity of the receiver is preferably used. The sensitivity characteristics of the receiver can be expressed by a noise figure (NF) which represents a degree of extracting reception signal from noises. The smaller the NF is, the better the sensitivity of the receiver is.

Recently, portable communication technologies in frequency bandwidths of 400 MHz to 2.5 GHz have been rapidly developed. Therefore, technologies for radio frequency (RF) devices and circuits have also been important. In such an RF device or system, a low-noise amplifier (LNA) is a circuit for amplifying a very small signal received through an antenna of a receiver without noise. In general, since the low-noise amplifier is disposed at the first state of the receiver, the NF of the low-noise amplifier determines a whole performance of the receiver. Therefore, in the low-noise amplifier, noise and signal deformation need to be suppressed.

FIG. 1 is a circuit diagram illustrating a conventional low-noise amplifier.

Referring to FIG. 1, the low-noise amplifier 100 includes three inductors Ld, Lg, and Ls and three MOS transistors M1, M2, and M3.

The inductor Ls is an input-impedance matching inductor. When a frequency of an input signal is $f_0$, an imaginary part of the input impedance is 0 (zero). At this time, the input impedance is matched to a desired value of 50Ω by adjusting the inductance of the input-impedance matching inductor Ls, so that maximum signal transmission can be obtained. The inductor Lg is a frequency-band inductor. A frequency band of operation of the low-noise amplifier is determined by adjusting the inductance of the frequency-band inductor Lg. The inductor Ld is a resonance inductor. The resonance inductor Ld together with a parasitic capacitance between a drain of the second MOS transistor M2 and a substrate and a gate capacitance of the third MOS transistor M3 constitutes a resonance circuit that resonates at a desired frequency.

The second MOS transistor M2 has a common gate amplifier structure in which reverse isolation between input and output can be increased. That is, an influx of a signal reflected from an apparatus which receives the output of the low-noise amplifier can be suppressed as large as possible. The feedback from the output to the input can be minimized, so that stability of the circuit can be improved. The third MOS transistor M3 has a common source amplifier structure in which gain can be increased.

The first MOS transistor M1, that is, an input transistor has a common source structure in which an inductor is inserted between the gate and the source. The input impedance $Z_i$ can be expressed by Equation 1.

$$Z_i = jw(L_s + L_g) + \frac{1}{jwC_{gs}} + \left(\frac{g_m}{C_{gs}}\right)L_s \approx w_T L_s \quad \text{[Equation 1]}$$

Here, if $Z_i$=50Ω by adjusting the value of Ls, the input impedance matching can be obtained. In this method, there is no need for connection to an external circuit, so that the method has an advantage in terms of noise figure (NF). The gain of the amplifier, that is, trans-conductance Gm is independent of bias, but it is correlated to only the input-impedance matching inductor Ls. [impedance→input impedance] The trans-conductance Gm and small-signal gain Av of the circuit can be expressed by Equations 2 and 3, respectively.

$$G_m = \frac{g_m}{w_0 C_{gs}(w_T L_s + R_s)} = \frac{1}{2w_0 L_s} \quad \text{[Equation 2]}$$

$$A_v = -G_m R_L \quad \text{[Equation 3]}$$

Referring to Equation 3, it can be seen that the small-signal gain $A_v$ of the low-noise amplifier that is subject to impedance and frequency matching is independent of bias, but it is inversely proportional to a signal frequency $w_0$ and source inductance Ls.

In design of such a low-noise amplifier shown in FIG. 1, it is necessary to minimize the noise figure (NF), to ensure IP3 (third order intercept point), to lower input impedance, and to maintain suitable gain. Here, a small value of the NF denotes that a low-noise amplifier generates a small amount of noise. If the NF has a small value, a low level of signal can be amplified irrespective of influence of noise, so that a small-sized antenna can be implemented.

However, although the aforementioned electric characteristics are satisfied, the gain of the low-noise amplifier needs to be varied so as to widen applications range of the low-noise amplifier.

SUMMARY OF THE INVENTION

The present invention provides a variable-gain low-noise amplifier.

According to an aspect of the present invention, there is provided a variable-gain low-noise amplifier comprising a first load, a second load, a third load, an input transistor, a pole/zero control circuit, and a gain control circuit. A first terminal of the first load is connected to a power-source voltage, and a second terminal thereof is connected to an output terminal. The second load is operated in response to a bias voltage, and a first terminal thereof is connected to the output terminal. A first terminal of the input transistor is connected to the second terminal of the second load, and a gate thereof is connected to an input terminal. The pole/zero control circuit adjusts frequency characteristics and a gain in response to at least one pole/zero control signal. A first terminal of the pole/zero control circuit is connected to the input terminal, and a second terminal thereof is connected to the output terminal. The gain control circuit adjusts the gain in response to at least one gain control signal. A first terminal of the gain control circuit is connected to a common terminal of the second load and the input transistor, a second terminal thereof is connected to the input terminal, and a third terminal thereof of is connected to a first terminal of the third load. A second terminal of the third load is connected to a ground voltage.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, embodiments of the present invention will be described in detail with reference to the accompanying drawings.

Figure 1:
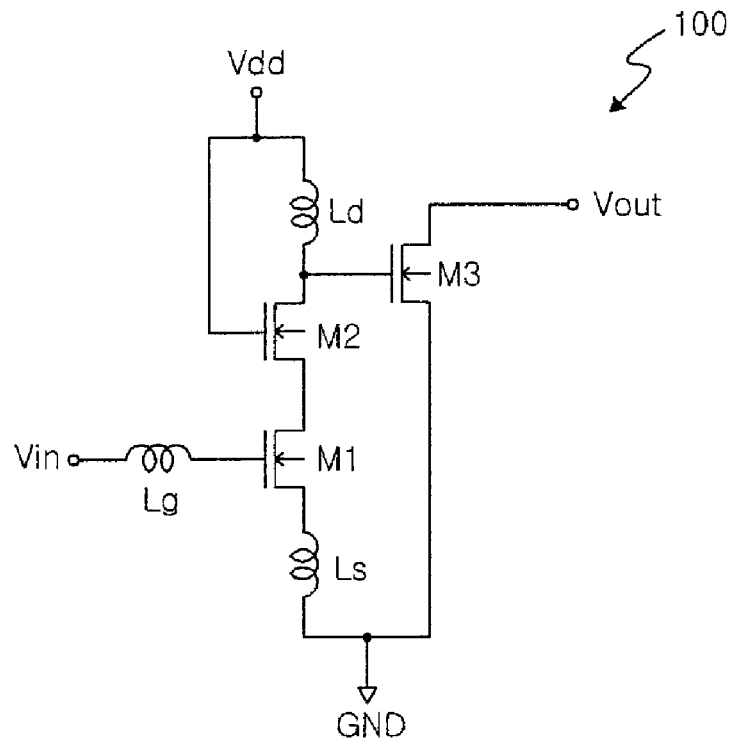
FIG. 1 is a circuit diagram illustrating a conventional low-noise amplifier.
Figure 2:
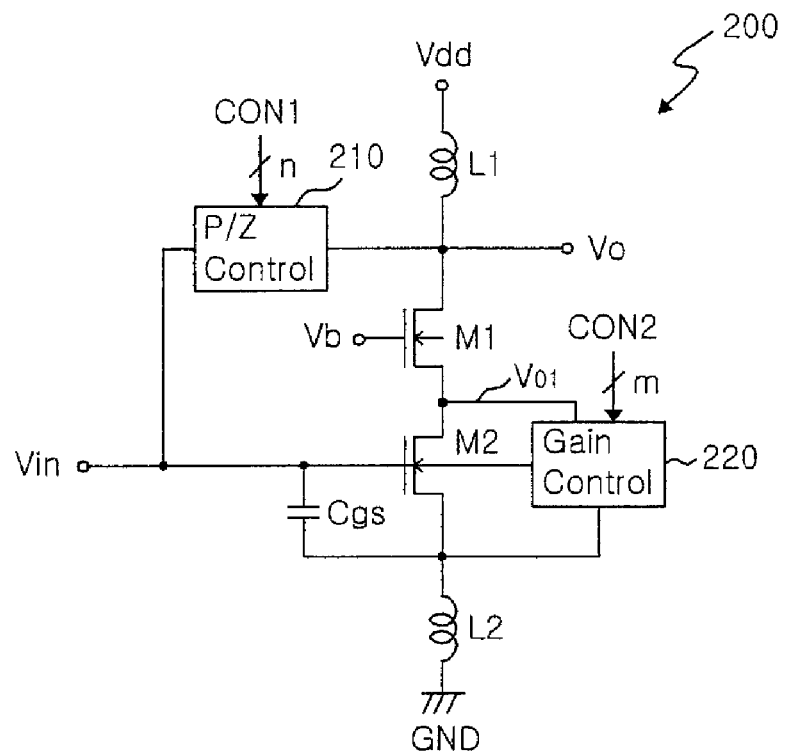
FIG. 2 is a conceptual view illustrating a low-noise amplifier with variable gain according to the present invention.

FIG. 2 is a conceptual view illustrating a low-noise amplifier with variable gain according to the present invention.

Referring to FIG. 2, the variable-gain low-noise amplifier 200 includes a first load L1, a second load M1, a third load L2, an input transistor M2, a pole/zero control circuit 210, a gain control circuit 220, and an input signal sustaining capacitor Cgs.

The first load L1 can be implemented with an inductor of which first terminal is connected to a power-source voltage Vdd and of which second terminal is connected to an output terminal Vo. The second load M1 can be implemented with an MOS transistor of which first terminal is connected to the output terminal Vo and of which gate is applied with a bias voltage Vb. A first terminal of the input transistor M2 is connected to the second terminal Vo1 of the second load M1, a second terminal thereof is connected to a second terminal of the third load L2, and a gate thereof is connected to the input terminal Vin.

The pole/zero control circuit 210 adjusts a gain and frequency characteristics of the low-noise amplifier 200 in response to at least one pole/zero control signal CON1. A first terminal of the pole/zero control circuit is connected to the input terminal Vin, and a second terminal thereof is connected to the output terminal Vo. The gain control circuit 220 adjusts the gain of the low-noise amplifier 200 in response to at least one gain control signal CON2. A first terminal of the gain control circuit is connected to a common node Vo1 of the second load M1 and the input transistor M2, a second terminal thereof is connected to the input terminal Vin, and a third terminal thereof is connected to a first terminal of the third load L2. The second terminal of the third load L2 is connected to a ground voltage GND. The third load can be implemented with an inductor.

A first terminal of the input signal sustaining capacitor Cgs is connected to the input terminal Vin, and a second terminal thereof is connected to the first terminal of the third load L2.

Figure 3:
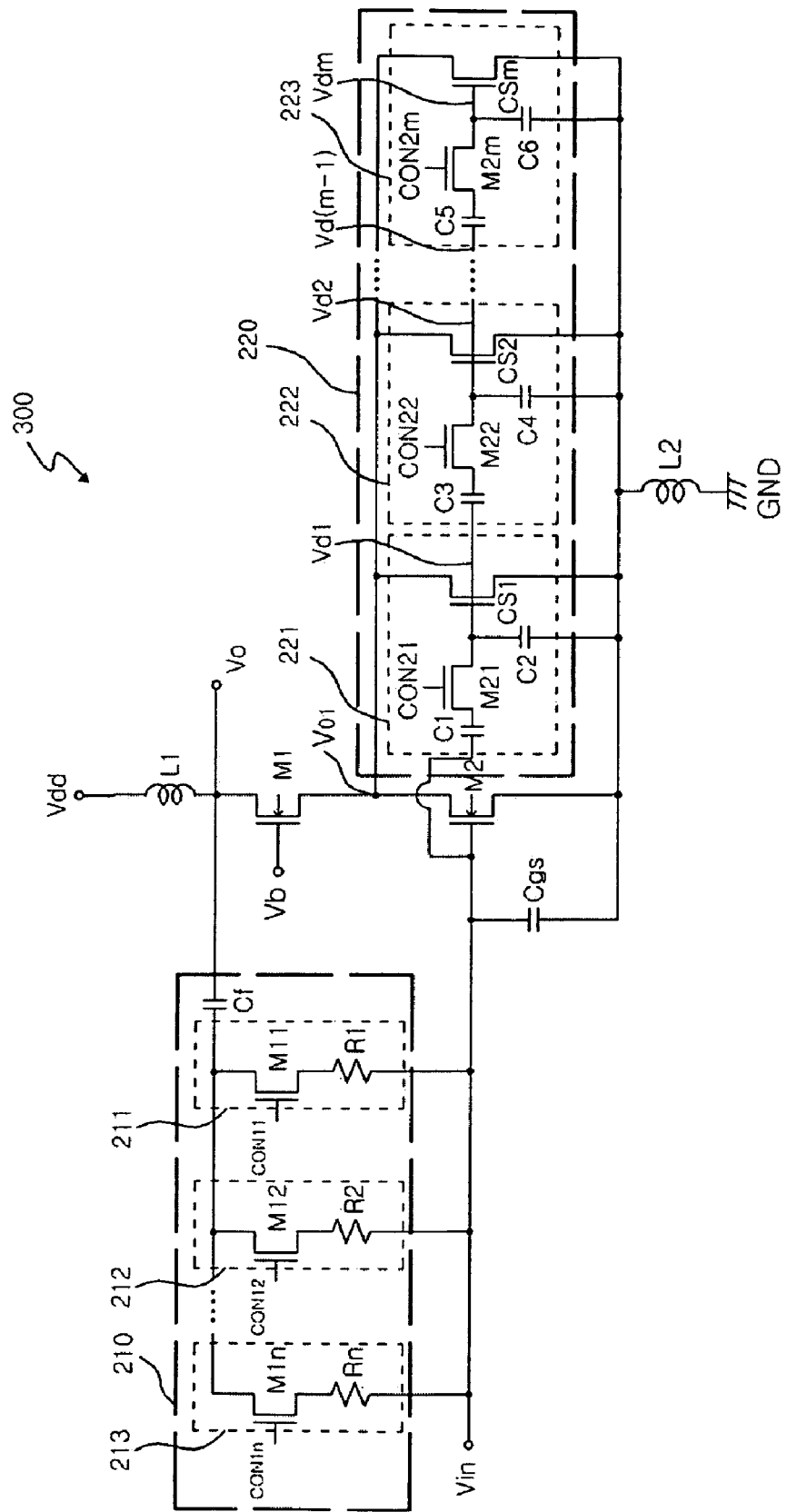
FIG. 3 is a view illustrating one embodiment of the variable-gain low-noise amplifier according to the present invention illustrated in FIG. 2.

FIG. 3 is a view illustrating one embodiment of the variable-gain low-noise amplifier according to the present invention illustrated in FIG. 2.

Referring to FIG. 3, the variable-gain low-noise amplifier 300 has the same construction as the variable-gain low-noise amplifier 200 except that 1) the pole/zero control circuit 210 and the gain control circuit 220 are illustrated more in detail, and 2) the pole/zero control signal CON1 is replaced with n (n is an integer) pole/zero control signals CON11 to CON1n, and the gain control signal CON2 is replaced with m (m is an integer) gain control signals CON21 to CON2m.

Accordingly, hereinafter, the pole/zero control circuit 210 and the gain control circuit 220 will be described more in detail.

The pole/zero control circuit 210 includes a feedback capacitor Cf, a first switch-resistor circuit 211, a second switch-resistor circuit 212, and an n-th switch-resistor circuit 213.

A first terminal of the feedback capacitor Cf is connected to the output terminal Vo.

The first switch-resistor circuit 211 includes an 11-th switch transistor M11 and a first resistor R1. A first terminal of the 11-th switch transistor M11 is connected to a second terminal of the feedback capacitor Cf, and a gate thereof is applied with the first pole/zero control signal CON11. A first terminal of the first resistor R is connected to a second terminal of the 11-th switch transistor M1, and a second terminal thereof is connected to the input terminal Vin.

The second switch-resistor circuit 212 includes a 12-th switch transistor M12 and a second resistor R2. A first terminal of the 12-th switch transistor M12 is connected to the second terminal of the feedback capacitor Cf, and a gate thereof is applied with the second pole/zero control signal CON12. A first terminal of the second resistor R2 is connected to a second terminal of the 12-th switch transistor M12, and a second terminal thereof is connected to the input terminal Vin.

The n-th switch-resistor circuit 213 includes a 1n-th switch transistor M1n and an n-th resistor Rn. A first terminal of the 1n-th switch transistor M1n is connected to the second terminal of the feedback capacitor Cf, and a gate thereof is applied with the n-th pole/zero control signal CON1n. A first terminal of the n-th resistor Rn is connected to a second terminal of the 1n-th switch transistor M1n, and a second terminal thereof is connected to the input terminal Vin.

The gain control circuit 220 includes a first gain control circuit 221, a second gain control circuit 222, and an m-th gain control circuit 223.

The first gain control circuit 221 includes a 21-th switch transistor M21, a first dividing capacitor C1, a second dividing capacitor C2, and a first current source transistor CS1. A first terminal of the first dividing capacitor C1 is connected to the input terminal Vin. A first terminal of the 21-th switch transistor M21 is connected to a second terminal of the first dividing capacitor C1, a second terminal thereof is connected to a node which generates the first divided voltage Vd1, and a gate thereof is applied with the first gain control signal CON21. A first terminal of the second dividing capacitor C2 is connect to the node which generates the first divided voltage Vd1, and a second terminal thereof is connected to the first terminal of the third load L2. A first terminal of the first current source transistor CS1 is connected to the common node Vo1 of the second load M1 and the input transistor M2, a second terminal thereof is connected to the first terminal of the third load L2, and a gate thereof is applied with the first divided voltage Vd1.

The second gain control circuit 222 includes a 22-th switch transistor M22, a third dividing capacitor C3, a fourth dividing capacitor C4, and a second current source transistor CS2. A first terminal of the third dividing capacitor C3 is connected to the node which generates the first divided voltage Vd1. A first terminal of the 22-th switch transistor M22 is connected to a second terminal of the third dividing capacitor C3, a second terminal thereof is connected to a node which generates the second divided voltage Vd2, and a gate thereof is applied with the second gain control signal CON22. A first terminal of the fourth dividing capacitor C4 is connected to the node which generates the second divided voltage Vd2, and a second terminal thereof is connected to the ground voltage GND of the third load L2. A first terminal of the second current source transistor CS2 is connected to the common node Vo1 of the second load M1 and the input transistor M2, a second terminal thereof is connected to the first terminal of the third load L2, and a gate thereof is applied with the second divided voltage Vd2.

The m-th gain control circuit 223 includes a 2m-th switch transistor M2m, a fifth dividing capacitor C5, a sixth dividing capacitor C6, and an m-th current source transistor CSm. A first terminal of the fifth dividing capacitor C5 is connected to a node which generates (m−1)-th divided voltage Vd(m−1). A first terminal of the 2m-th switch transistor M2m is connected to a second terminal of the fifth dividing capacitor C5, a second terminal thereof is connected to a node which generates the m-th divided voltage Vdm, and a gate thereof is applied with the m-th gain control signal CON2m. A first terminal of the sixth dividing capacitor C6 is connected to the node which generates the m-th divided voltage Vdm, a second terminal thereof is connected to the first terminal of the third load L2. A first terminal of the m-th current source transistor CSm is connected to the common node Vo1 of the second load M1 and the input transistor M2, a second terminal thereof is connected to the first terminal of the third load L2, and a gate thereof is applied with the m-th divided voltage Vdm.

Figure 4:
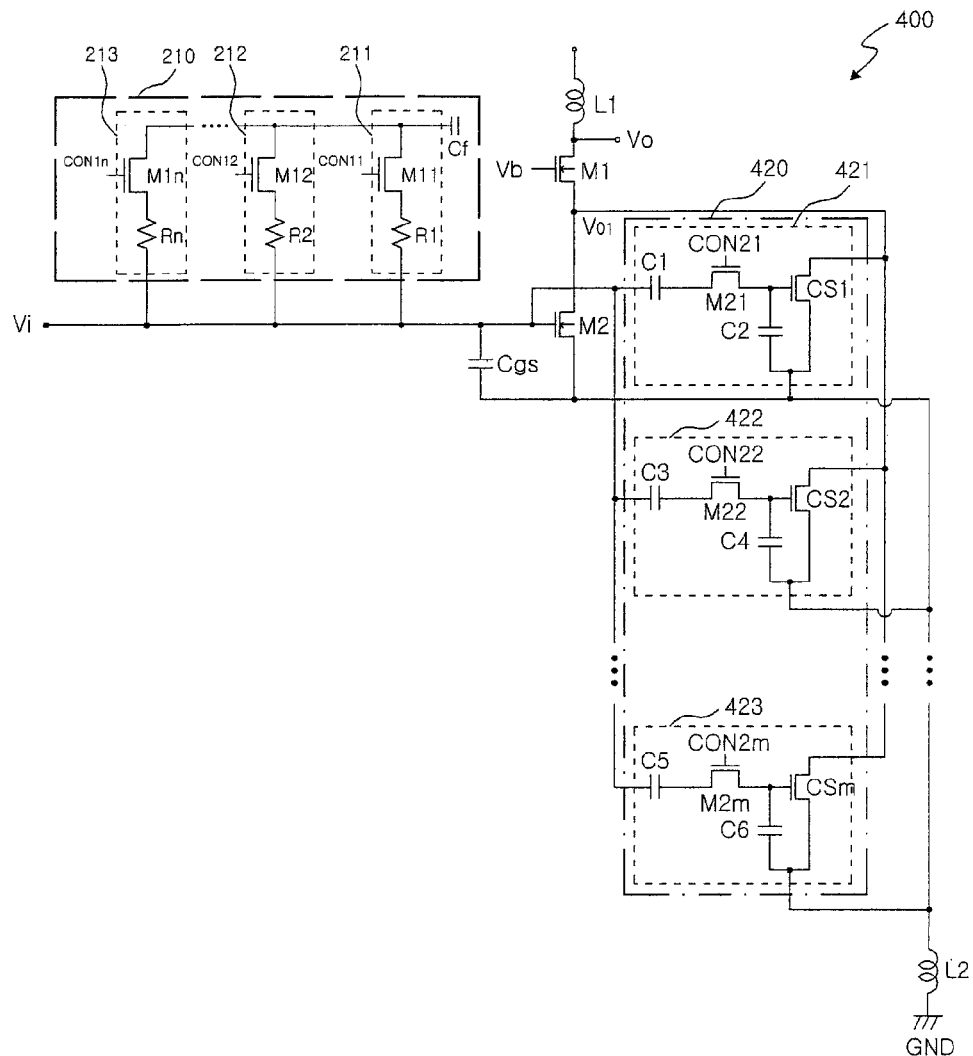
FIG. 4 is a view illustrating another embodiment of the variable-gain low-noise amplifier according to the present invention illustrated in FIG. 3.

FIG. 4 is a view illustrating another embodiment of the variable-gain low-noise amplifier according to the present invention illustrated in FIG. 3.

Referring to FIG. 4, the variable-gain low-noise amplifier 400 has the same construction as low-noise amplifier 300 shown in FIG. 3 except for a gain control circuit 420. Accordingly, hereinafter, only the gain control circuit 420 will be descried more in detail.

The gain control circuit 420 includes a first gain control circuit 421, a second gain control circuit 422, and an m-th gain control circuit 423.

The first gain control circuit 421 includes a 21-th switch transistor M21, a first dividing capacitor C1, a second dividing capacitor C2, and a first current source transistor CS1. A first terminal of the first dividing capacitor C1 is connected to the input terminal Vin. A first terminal of the 21-th switch transistor M21 is connected to a second terminal of the first dividing capacitor C1, and a gate thereof is applied with the first gain control signal CON21. A first terminal of the second dividing capacitor C2 is connected to a second terminal of the 21-th switch transistor M21, and a second terminal thereof is connected to the first terminal of the third load L2. A first terminal of the first current source transistor CS1 is connected to the common node Vo1 of the second load M1 and the input transistor M2, a second terminal thereof is connected to the first terminal of the third load L2, and a gate there of is connected to a common terminal of the 21-th switch transistor M21 and the second dividing capacitor C2.

The second gain control circuit 422 includes a 22-th switch transistor M22, a third dividing capacitor C3, a fourth dividing capacitor C4, and a second current source transistor CS2. A first terminal of the third dividing capacitor C3 is connected to the input terminal Vin. A first terminal of the 22-th switch transistor M22 is connected to a second terminal of the third dividing capacitor C3, and a gate thereof is applied with the second gain control signal CON22. A first terminal of the fourth dividing capacitor C4 is connected to a second terminal of the 22-th switch transistor M22, and a second terminal thereof is connected to the first terminal of the third load L2. A first terminal of the second current source transistor CS2 is connected to the common node Vo1 of the second load M1 and the input transistor M2, a second terminal thereof is connected to the first terminal of the third load L2, and a gate is connected to a common terminal of the 22-th switch transistor M22 and the fourth dividing capacitor C4.

The m-th gain control circuit 423 includes a 2m-th switch transistor M2m, a fifth dividing capacitor C5, a sixth dividing capacitor C6, and an m-th current source transistor CSm. A first terminal of the fifth dividing capacitor C5 is connected to the input terminal Vin. A first terminal of the 2m-th switch transistor M2m is connected to a second terminal of the fifth dividing capacitor C5, and a gate thereof is applied with the m-th gain control signal CON2m. A first terminal of the sixth dividing capacitor C6 is connected to a second terminal of the 2m-th switch transistor M2m, and a second terminal thereof is connected to the first terminal of the third load L2. A first terminal of the m-th current source transistor CSm is connected to the common node Vo1 of the second load M1 and the input transistor M2, a second terminal thereof is connected to the first terminal of the third load L2, and a gate thereof is connected to a common terminal of the 2m-th switch transistor M2m and the sixth dividing capacitor C6.

Hereinafter, operations of the variable-gain low-noise amplifier according to the present invention will be described.

Figure 5:
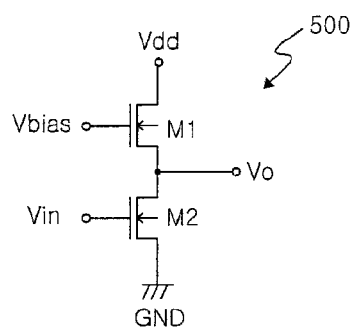
FIG. 5 is a view illustrating a general amplifier having an inverter structure.

FIG. 5 is a view illustrating a general amplifier having an inverter structure.

Referring to FIG. 5, the general amplifier 500 includes a load MOS transistor M1 and an input transistor M2. A first terminal of the load MOS transistor M1 is connected to the power-source voltage Vdd, a second terminal thereof is connected to the output terminal Vo, and a gate thereof is applied with a bias voltage Vbias. A first terminal of the input transistor M2 is connected to the output terminal Vo, a second terminal thereof is connected to the ground voltage GND, and a gate thereof is applied with the input signal Vin.

A gain of the variable-gain low-noise amplifier 500 can be expressed by Equation 4.

$$A_v = \frac{Vo}{Vin} = -\frac{g_{m2}}{g_{o1} + g_{o2} + g_{mb1}} \qquad \text{[Equation 4]}$$

Here, $g_{o1}$ and $g_{o2}$ denote conductances of the load MOS transistor M1 and the input transistor M2, respectively. In addition, since a bulk bias of the load MOS transistor M1 is directly connected to a substrate but not the output terminal Vo, $g_{m1b}$ is a back-gate transconductance which is generated due to a body effect that a voltage of the substrate serves like a gate signal, and $g_{m2}$ is a transconductance of the input transistor M2.

In general, since back-gate transconductance $g_{m1b}$ is larger than the conductances of the load MOS transistor M1 and the input transistor M2, Equation 4 can be reduced into Equation 5.

$$A_v = \frac{Vo}{Vin} = -\frac{g_{m2}}{g_{mb1}} \qquad \text{[Equation 5]}$$

Since the back-gate transconductance $g_{m1b}$ is a fixed value, as the transconductance $g_{m2}$ of the input transistor M2 is varied, the gain of the amplifier can be varied. Since the conductance can be considered as a current, in the following description, the current and conductance will be treated as the same concept.

As shown in FIG. 3, the gain control circuit 220 of the variable-gain low-noise amplifier 300 includes a plurality of gain control circuits 221 to 223 which have the respective current sources CS1 to CSm. The first current source CS1 included in the first gain control circuit 221 can supply a constant source current through the common terminal of the second load M1 and the input transistor M2 in response to the first divided voltage Vd1 generated by dividing the input signal Vin based on a capacitance difference between two dividing capacitors C1 and C2. The second current source CS2 included in the second gain control circuit 222 can supply a constant source current through the common terminal of the second load M1 and the input transistor M2 in response to the second divided voltage Vd2 generated by dividing the first divided voltage Vd1 based on a capacitance difference between two dividing capacitors C3 and C4. Similarly, the m-th current source CSm included in the m-th gain control circuit 223 can supply a constant source current through the common terminal of the second load M1 and the input transistor M2 in response to the m-th divided voltage Vdm generated by dividing the (m−1)-th divided voltage Vd(m−1) based on a capacitance difference between two dividing capacitors C5 and C6.

Similarly, as shown in FIG. 4, the gain control circuit 420 of the variable-gain low-noise amplifier 400 includes a plurality of gain control circuits 421 to 423 which have the respective current sources CS1 to CSm. The first current source CS1 included in the first gain control circuit 421 can supply a constant source current through the common terminal of the second load M1 and the input transistor M2 in response to a divided voltage generated by dividing the input signal Vin based on a capacitance difference between two dividing capacitors C1 and C2. The second current source CS2 included in the second gain control circuit 422 can supply a constant source current through the common terminal of the second load M1 and the input transistor M2 in response to a divided voltage generated by dividing the input signal Vin based on a capacitance difference between two dividing capacitors C3 and C4. Similarly, the m-th current source CSm included in the m-th gain control circuit 423 can supply a constant source current through the common terminal of the second load M1 and the input transistor M2 in response to a divided voltage generated by dividing the input voltage Vin based on a capacitance difference between two dividing capacitors C5 and C6.

Referring to the above description and Equation 5, since the gain of the amplifier is proportional to an amount of varied source current supplied through the common terminal of the second load M1 and the input transistor M2, the low-noise amplifier according to the present invention can vary the amount of the source current supplied through the common terminal of the second load M1 and the input transistor M2. The gain control circuit 220 shown in FIG. 3 is different from the gain control circuit 420 shown in FIG. 4 in that a plurality of the gain control circuits 221, 222, and 223 are connected in series to each other, but a plurality of the gain control circuits 421, 422, and 423 are connected in parallel to each other. In case of FIG. 3, since a plurality of the gain control circuits 221, 222, and 223 are connected in series to each other, if a front gain control circuit is not selected, a following gain control circuit is disabled. In case of FIG. 4, since a plurality of the gain control circuits 421, 422, and 423 are connected in parallel to each other, each gain control unit can separately operated irrespective of selection of other gain control units.

The conventional amplifier shown in FIG. 5 is different from the variable-gain low-noise amplifier shown in FIGS. 3 and 4 according to the present invention in that the output terminal Vo of the conventional amplifier is connected to the common terminal of the second load M1 and the input transistor M2, but the output terminal of the amplifiers according to the present invention is connected to the common terminal of the first load L1 and the second load M1. In the variable-gain low-noise amplifiers according to the present invention, the same gain can be obtained except that the voltage level of the output terminal Vo is increased by a voltage drop across the second load M1.

The pole/zero control circuit 210 connected between the output terminal Vo and the input terminal Vin performs a function of controlling poles and zero points on a frequency response curve so as to stabilize electric characteristics such as a phase margin in a frequency band where the amplifier is operated. Since this function is well-known, description thereof is omitted.

Figure 6:
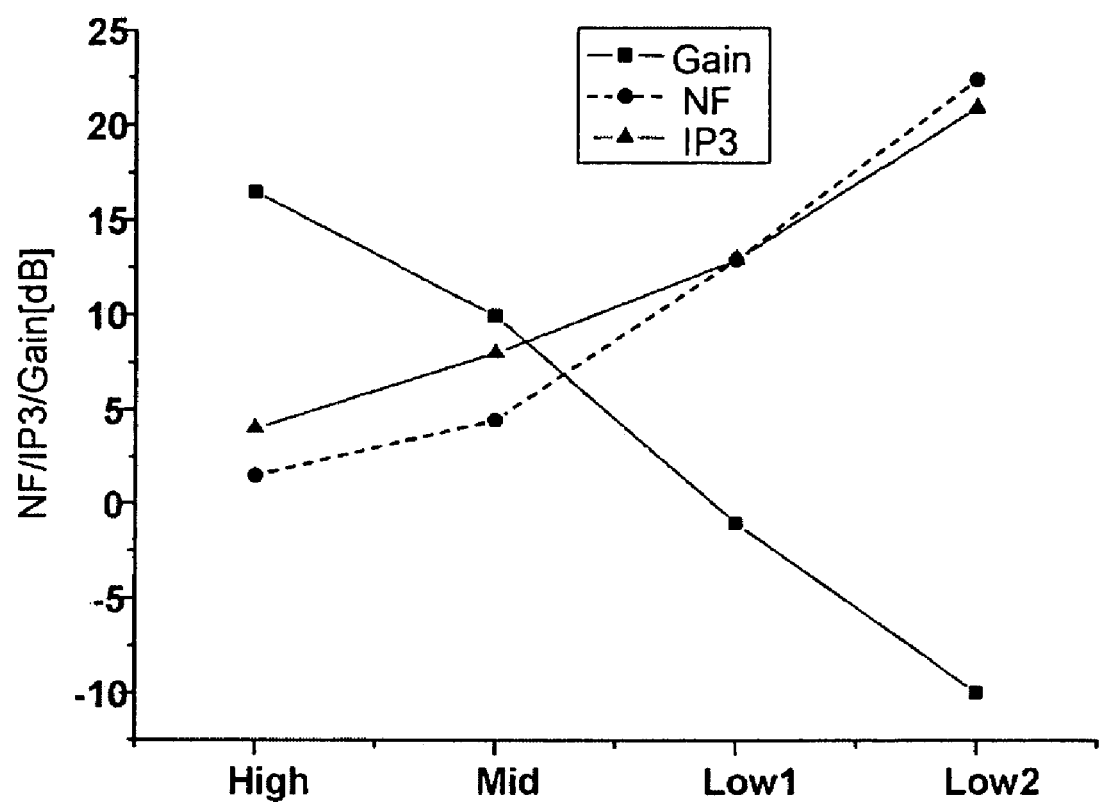
FIG. 6 is a graph illustrating a result of computer simulation of the variable-gain low-noise amplifier according to the present invention.

FIG. 6 is a graph illustrating a result of computer simulation of the variable-gain low-noise amplifier according to the present invention.

Referring to FIG. 6, the computer simulation is carried out in various regions; a high-gain region High, a middle-gain region Mid, and low-gain regions Low1 and Low2. As the gain is varied from the high-gain region H to the low-gain region Low2, noise figure (NF) and the third order intercept point (IP3) are linearly varied.

Sensitivity characteristics of a receiver can be expressed by using the NF which represents a degree of extracting a received signal from noises. As described above, the smaller the NF is, the better the sensitivity is. However, in a case where the gain of the amplifier is varied like the variable-gain low-noise amplifier according to the present invention, the linearity of the NF and IP3 becomes more important factor. According to the variable-gain low-noise amplifier of the present invention, since the NF and IP3 are linearly varied, desired electric characteristics can be obtained.

As described above, in a variable-gain low-noise amplifier according to the present invention, a gain thereof can be varied, and characteristics of NF and IP3 can also be linearly varied, so that the variable-gain low-noise amplifier can be used for general purposes without separate design of a new low-low amplifier matching with characteristics of a receiving stage.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A variable-gain low-noise amplifier comprising:
a first load L1 of which first terminal is connected to a power-source voltage Vdd and of which second terminal is connected to an output terminal Vo;
a second load M1 which is operated in response to a bias voltage Vb and of which first terminal is connected to the output terminal Vo;
an input transistor M2 of which first terminal is connected to the second terminal of the second load M1 and of which gate is connected to an input terminal Vin;
a pole/zero control circuit 210 which adjusts frequency characteristics and a gain in response to at least one pole/zero control signal CON1, of which first terminal is connected to the input terminal Vin, and of which second terminal is connected to the output terminal Vo;

a gain control circuit 220 which adjusts the gain in response to at least one gain control signal CON2, of which first terminal is connected to a common terminal of the second load M1 and the input transistor M2, and of which second terminal is connected to the input terminal Vin; and a third load L2 of which first terminal is connected to a second terminal of the input transistor M2 and a third terminal of the gain control circuit 220 and of which second terminal is connected to a ground voltage GND.

2. The variable-gain low-noise amplifier according to claim 1, wherein the pole/zero control circuit 210 comprises:

a feedback capacitor Cf of which first terminal is connected to the output terminal Vo;

a first switch-resistor circuit 211 which is operated in response to a first pole/zero control signal CON11, of which first terminal is connected to a second terminal of the feedback capacitor Cf, and of which second terminal is connected to the input terminal Vin;

a second switch-resistor circuit 212 which is operated in response to a second pole/zero control signal CON12, of which first terminal is connected to a second terminal of the feedback capacitor Cf, and of which second terminal is connected to the input terminal Vin; and an n-th switch-resistor circuit 213 which is operated in response to an n-th (n is an integer) pole/zero control signal CON1n, of which first terminal is connected to the second terminal of the feedback capacitor Cf, and of which second terminal is connected to the input terminal Vin.

3. The variable-gain low-noise amplifier according to claim 2, wherein the first switch-resistor circuit 211 includes a 11-th switch transistor M11 of which first terminal is connected to the second terminal of the feedback capacitor Cf and of which gate is applied with the first pole/zero control signal CON11 and a first resistor R1 of which first terminal is connected to a second terminal of the 11-th switch terminal M11 and of which second terminal is connected to the input terminal Vin;

wherein the second switch-resistor circuit 212 includes a 12-th switch transistor M12 of which first terminal is connected to the second terminal of the feedback capacitor Cf and of which gate is applied with the second pole/zero control signal CON12 and a second resistor R2 of which first terminal is connected to a second terminal of the 12-th switch transistor M12 and of which second terminal is connected to the input voltage Vin; and wherein the n-th switch-resistor circuit 213 includes a 1n-th switch transistor M1n of which first terminal is connected to the second terminal of the feedback capacitor Cf and of which gate is applied with the n-th pole/zero control signal CON1n and an n-th resistor Rn of which first terminal is connected to a second terminal of the 1n-th switch transistor M1n and of which second terminal is connected to the input terminal Vin.

4. The variable-gain low-noise amplifier according to claim 1, wherein the gain control circuit 220 comprises:

a first gain control circuit 221 which changes a voltage of the common terminal Vo1 of the second load M1 and the input transistor M2 connected to the first terminal in response to a first gain control signal CON21 and a voltage applied to the input terminal Vin and generates a first divided voltage Vd1 by dividing the input voltage Vin with a predetermined ratio;

a second gain control circuit 222 which changes the voltage of the common terminal Vo1 of the second load M1 and the input transistor M2 connected to the first terminal in response to a second gain control signal CON22 and the first divided voltage Vd1 and generates a second divided voltage Vd2 by dividing the first divided voltage Vd1 with a predetermined ratio; and an m-th (m is an integer) gain control circuit 223 which changes the voltage of the common terminal Vo1 of the second load M1 and the input transistor M2 connected to the first terminal in response to an m-th gain control signal CON2m and an (m−1)-th divided voltage Vd(m−1) and generates an m-th divided voltage Vdm by dividing the (m−1)-th divided voltage Vd(m−1) with a predetermined ratio.

5. The variable-gain low-noise amplifier according to claim 4, wherein the first gain control circuit 221 comprises:

a first dividing capacitor C1 of which first terminal is connected to the input terminal Vin;

a 21-th switch transistor M21 of which first terminal is connected to a second terminal of the first dividing capacitor C1, of which gate is applied with the first gain control signal CON21, and of which second terminal is connected to the first divided voltage Vd1;

a second dividing capacitor C2 of which first terminal is connected to a node generating the first divided voltage Vd1 and of which second terminal is connected to the first terminal of the third load L2;

a first current source transistor CS1 of which first terminal is connected to the common terminal Vo1 of the second load M1 and the input transistor M2, of which second terminal is connected to the first terminal of the third load L2, and of which gate is applied with the first divided voltage Vd1, wherein the second gain control circuit 222 comprises:

a third dividing capacitor C3 of which first terminal is connected to the node generating the first divided voltage Vd1;

a 22-th switch transistor M22 of which first terminal is connected to a second terminal of the third dividing capacitor C3, of which gate is applied with the second gain control signal CON22, and of which second terminal is connected to the second divided voltage Vd2;

a fourth dividing capacitor C4 of which first terminal is connected to a node generating the second divided voltage Vd2 and of which second terminal is connected to the first terminal of the third load L2; and a second current source transistor CS2 of which first terminal is connected to the common terminal Vo1 of the second load M1 and the input transistor M2, of which second terminal is connected to the first terminal of the third load L2, and of which gate is applied with the second divided voltage Vd2, and wherein the m-th gain control circuit 223 comprises:

a fifth dividing capacitor C5 of which first terminal is connected to a node generating the (m−1)-th divided voltage Vd(m−1);

a 2m-th switch transistor M2m of which first terminal is connected to a second terminal of the fifth dividing capacitor C5, of which gate is applied with the m-th gain control signal CON2m, and of which second terminal is connected to a node generating the m-th divided voltage Vdm;

a sixth dividing capacitor C6 of which first terminal is connected to the node generating the m-th divided voltage Vdm and of which second terminal is connected to the first terminal of the third load L2; and an m-th current source transistor CSm of which first terminal is connected to the common terminal Vo1 of the second load M1 and the input transistor M2, of which second terminal is connected to the first terminal of the third load L2, and of which gate is applied with the m-th divided voltage Vdm.

6. The variable-gain low-noise amplifier according to claim 1, wherein the gain control circuit 420 comprises:

a first gain control circuit 421 which changes a voltage of the common terminal Vo1 of the second load M1 and the input transistor M2 connected to the first terminal in response to a first gain control signal CON21 and a voltage applied from the input terminal Vin;

a second gain control circuit 422 which changes the voltage of the common terminal Vo1 of the second load M1 and the input transistor M2 connected to the first terminal in response to the second gain control signal CON22 and the voltage applied from the input terminal Vin; and an m-th gain control circuit 423 which changes the voltage of the common terminal Vo1 of the second load M1 and the input transistor M2 connected to the first terminal in response to the m-th (m is an integer) gain control signal CON2m and the voltage applied from the input terminal Vin.

7. The variable-gain low-noise amplifier according to claim 6, wherein the first gain control circuit 421 comprises:

a first dividing capacitor C1 of which first terminal is connected to the input terminal Vin;

a 21-th switch transistor M21 of which first terminal is connected to a second terminal of the first dividing capacitor C1 and of which gate is applied with the first gain control signal CON21;

a second dividing capacitor C2 of which first terminal is connected to the second terminal of the 21-th switch transistor M21 and of which second terminal is connected to the first terminal of the third Load L2; and a first current source transistor CS1 of which first terminal is connected to the common terminal Vo1 of the second load M1 and the input transistor M2, of which second terminal is connected to the first terminal of the third Load L2, and of which gate is connected to a common terminal of the 21-th switch transistor M21 and the second dividing capacitor C2, wherein the second gain control circuit 422 comprises:

a third dividing capacitor C3 of which first terminal is connected to the input voltage Vin;

a 22-th switch transistor M22 of which first terminal is connected to a second terminal of the third dividing capacitor C3 and of which second terminal is connected to the second gain control signal CON22;

a fourth dividing capacitor C4 of which first terminal is connected to the second terminal of the 22-th switch transistor M22 and of which second terminal is connected to the first terminal of the third load L2; and a second current source transistor CS2 of which first terminal is connected to the common terminal Vo1 of the second load M1 and the input transistor M2, of which second terminal is connected to the first terminal of the third load L2, and of which gate is connected to a common terminal of the 22-th switch transistor M22 and the fourth dividing capacitor C4, and wherein the m-th gain control circuit 423 comprises:

a fifth dividing capacitor C5 of which first terminal is connected to the input terminal Vin;

a 2m-th switch transistor M2m of which first terminal is connected to a second terminal of the fifth dividing capacitor C5 and of which second terminal is connected to the m-th gain control signal CON2m;

a sixth dividing capacitor C6 of which first terminal is connected to a second terminal of the 2m-th switch transistor M2m and of which second terminal is connected to the first terminal of the third load L2; and an m-th current source transistor CSm of which first terminal is connected to the common terminal Vo1 of the second load M1 and the input transistor M2, of which second terminal is connected to the first terminal of the third load L2, and of which gate is connected to a common terminal of the 2m-th switch transistor M2m and the sixth dividing capacitor C6.

8. The variable-gain low-noise amplifier according to claim 1, wherein first load L1 is an inductor of which first terminal is connected to the power-source voltage Vdd and of which second terminal is connected to the output terminal Vo, wherein the second load M1 is a load MOS transistor M1 of which first terminal is connected to the output terminal Vo and of which second terminal is connected to the first terminal of the input transistor M2, and wherein the third load L2 is an inductor of which first terminal is connected to the second terminal of the input transistor M2 and the third terminal of the gain control circuit 220 and of which second terminal is connected to a ground voltage GND.

9. The variable-gain low-noise amplifier according to claim 1, further comprising a bias circuit which generates the bias voltage Vb.

10. The variable-gain low-noise amplifier according to claim 1, further comprising an input signal sustaining capacitor Cgs of which first terminal is connected to the input terminal Vin and of which second terminal is connected to the first terminal of the third load L2.

11. The variable-gain low-noise amplifier according to claim 1, wherein a control circuit which generate at least one pole/zero control signal CON1 and at least one gain control signal CON2.

* * * * *